(12) United States Patent
Widodo et al.

(10) Patent No.: US 8,143,651 B2
(45) Date of Patent: Mar. 27, 2012

(54) NESTED AND ISOLATED TRANSISTORS WITH REDUCED IMPEDANCE DIFFERENCE

(75) Inventors: Johnny Widodo, Singapore (SG); Liang Choo Hsia, Singapore (SG); James Yong Meng Lee, Singapore (SG); Wen Zhi Gao, Singapore (SG); Zhao Lun, Singapore (SG); Huang Liu, Singapore (SG); Chung Woh Lai, Singapore (SG); Shailendra Mishra, Singapore (SG); Yew Tuck Chow, Singapore (SG); Fang Chen, Singapore (SG); Shiang Yang Ong, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/848,999

(22) Filed: Aug. 2, 2010

(65) Prior Publication Data

US 2010/0301424 A1    Dec. 2, 2010

Related U.S. Application Data

(62) Division of application No. 12/031,693, filed on Feb. 14, 2008, now Pat. No. 7,767,577.

(51) Int. Cl.
| | |
|---|---|
| H01L 27/10 | (2006.01) |
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |

(52) U.S. Cl. ............. 257/204; 257/384; 257/E21.165; 257/E21.641; 257/E29.255

(58) Field of Classification Search .......... 257/204, 257/E21.165, E21.641, 384, E29.555
See application file for complete search history.

(56) References Cited

U.S. PATENT DOCUMENTS

| | | |
|---|---|---|
| 4,398,335 A | 8/1983 | Lehrer |
| 7,456,096 B2 | 11/2008 | Yamauchi et al. |
| 2006/0121677 A1 | 6/2006 | Parekh et al. |

*Primary Examiner* — David S Blum
(74) *Attorney, Agent, or Firm* — Horizon IP Pte Ltd (57) ABSTRACT

A processing layer, such as silicon, is formed on a metal silicide contact followed by a metal layer. The silicon and metal layers are annealed to increase the thickness of the metal silicide contact. By selectively increasing the thickness of silicide contacts, $R_s$ of transistors in iso and nested regions can be matched.

19 Claims, 11 Drawing Sheets

NESTED AND ISOLATED TRANSISTORS WITH REDUCED IMPEDANCE DIFFERENCE

CROSS-REFERENCE TO RELATED APPLICATION

This application is a divisional application which claims benefit of U.S. patent application Ser. No. 12/031,693, now U.S. Pat. No. 7,767,577, filed on Feb. 14, 2008. All disclosures are incorporated herewith by reference.

FIELD OF THE INVENTION

The present invention relates to integrated circuits (ICs). More particularly, the invention relates to reducing the difference in resistance between nested and isolated transistors.

DESCRIPTION OF THE RELATED ART

The fabrication of ICs involves the formation of features on a substrate that make up circuit components, such as transistors, resistors and capacitors. The circuit components are interconnected as desired to achieve the desired function.

Figure 1:
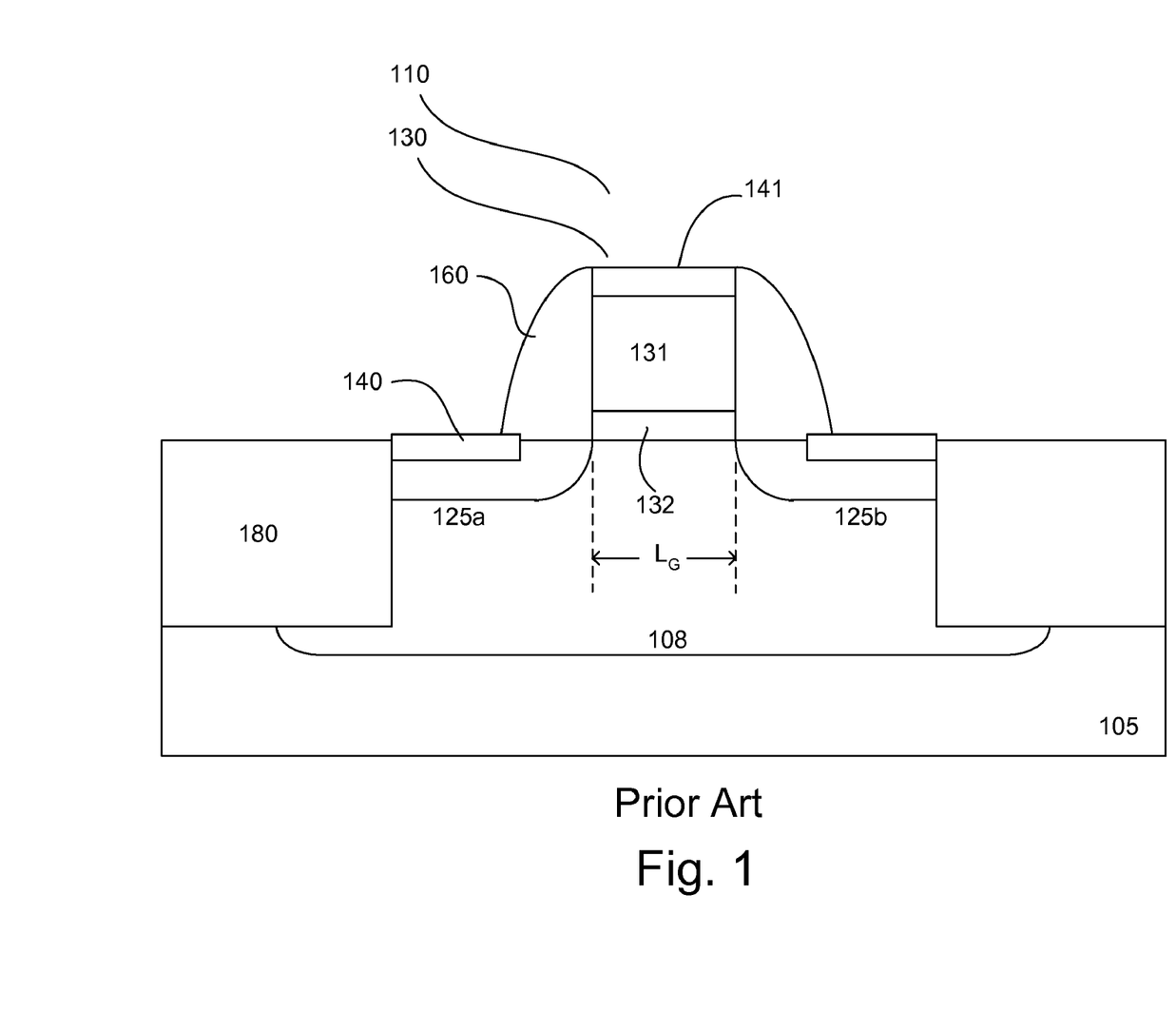
FIG. 1 shows a conventional transistor.

FIG. 1 shows a conventional transistor 110. The transistor is formed on a doped well 108. The transistor has source/drain diffusion regions 125a-b adjacent to a gate 130, which includes a gate electrode 131 over gate dielectric layer 132. The gate electrode typically is formed from polysilicon. Located on the gate sidewalls are dielectric sidewall spacers 160. Metal silicide contacts 140 and 141 are provided on the surface of the substrate in the source/drain regions and gate electrodes. The distance $L_G$ between the source/drain regions under the gate is referred to as the gate length. Isolation regions 180 can be provided within substrate 105.

ICs can include p-type, n-type or both types of transistors. Typically, the IC includes areas which have densely populated transistors (nested regions) or less densely populated transistors (iso regions). Conventional processes for forming ICs result in transistors having different operating parameters, such as switching speed. This is undesirable as this requires IC designs to accommodate the transistors with the slowest switching speed, impacting overall IC performance.

From the foregoing, it is desirable to provide transistors in ICs having similar operating parameters.

SUMMARY OF THE INVENTION

The present invention relates to a method of forming a contact or an IC. The method includes providing a substrate with a metal silicide contact. A processing layer, such as silicon, is formed on the metal silicide contact. The processing layer can be formed by CVD, ALD or ion implantation. A metal layer is deposited over the processing layer. The substrate is processed to cause a reaction between the processing and metal layers, thereby increasing the thickness of the metal silicide contact. The steps of forming a processing layer, depositing a metal layer and processing the substrate can be repeated until the thickness of the contact is at a target thickness.

In another aspect, the invention relates to an IC. The IC includes a substrate on which the IC is formed. The substrate has first and second device regions defined thereon. The defined regions are populated with semiconductor devices having contacts, such as transistors. The first region has more densely populated devices than the second device region. The $R_s$ of the devices in the device regions are substantially the same.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DETAILED DESCRIPTION OF THE INVENTION

The present invention relates to improving performance parameters of transistors, such as switching speed. In one embodiment, the invention relates to providing transistors having consistent performance parameters on the IC. For example, nFETs or ICs in both iso and nested regions have consistent performance parameters.

Figure 2A:
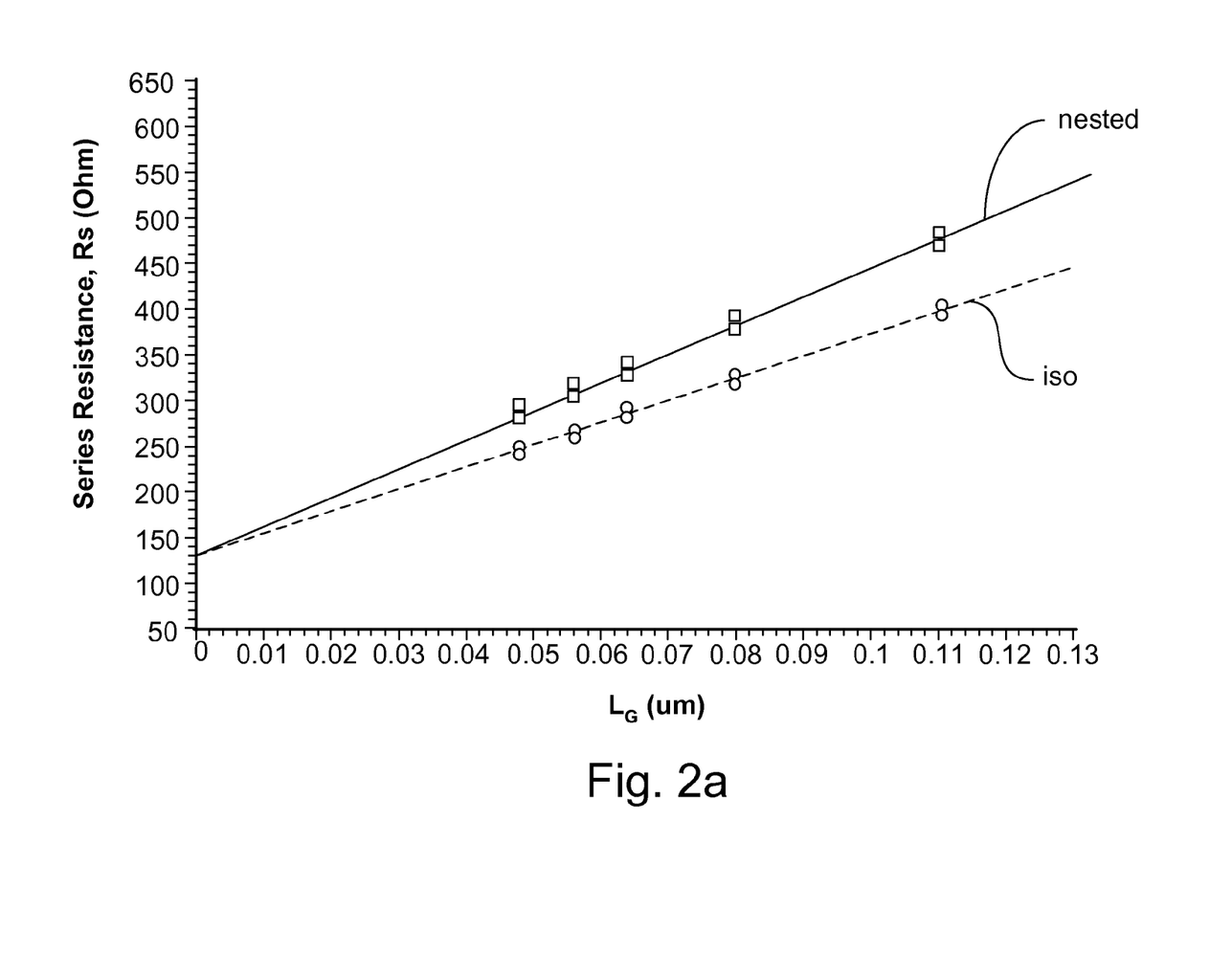
FIGS. 2a-b show simulated series resistance of p-type and n-type iso and nested transistors respectively as a function of gate length.
Figure 2B:
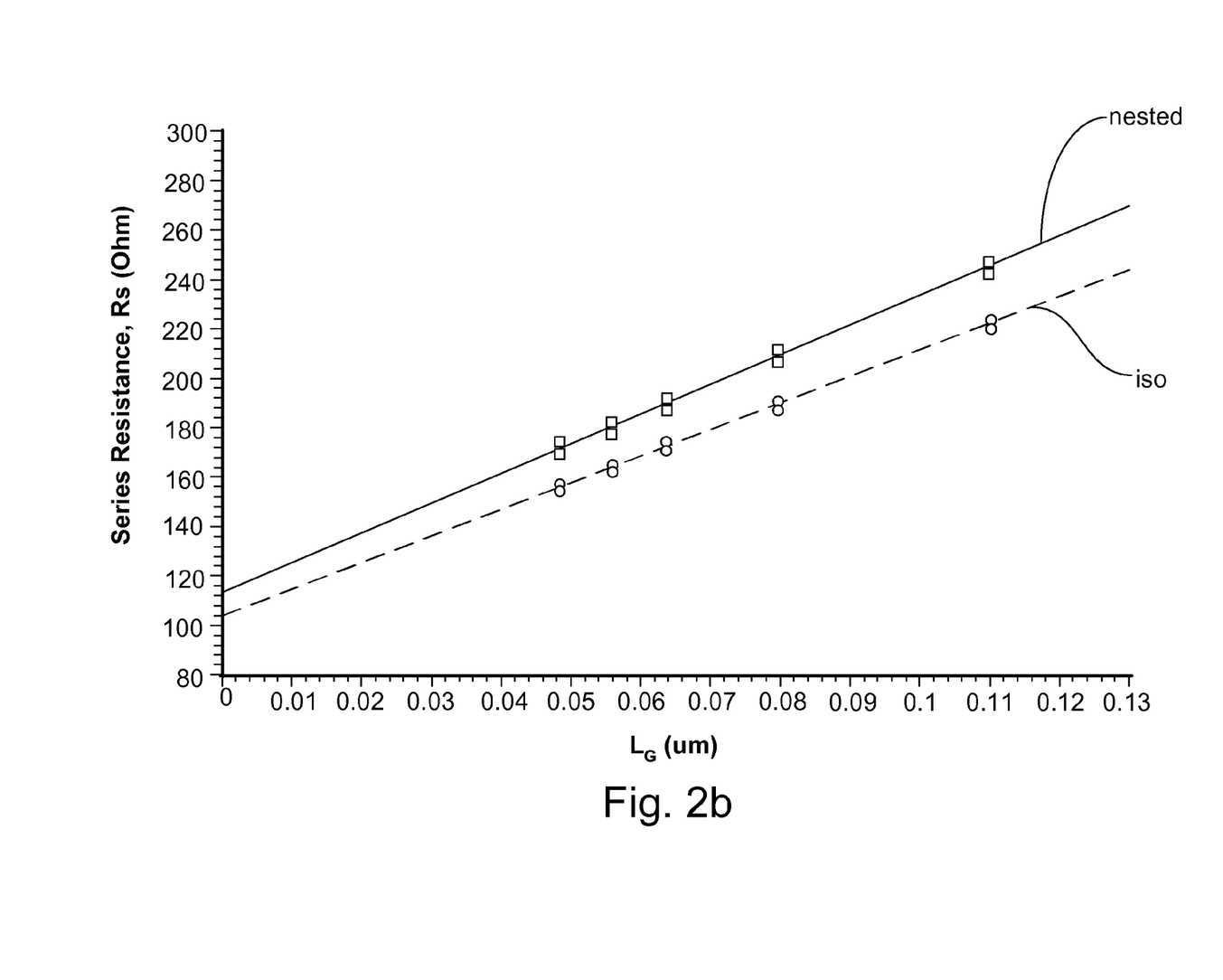

We have discovered that series resistance ($R_s$) of gate electrodes are different in the nested and iso regions. FIGS. 2a-b show simulated $R_s$ of p-type transistors and n-type transistors as a function of gate length ($L_G$) in nested and iso regions. $R_s$ of transistors were simulated at $L_G$ of 48 µm, 56 µm, 64 µm, 80 µm and 110 µm and measured at 25° C. $R_s$ is determined by the following equations:

$$R_s = 50\ \mathrm{mV}/(I_{dlin}@VG-V_{Tlin}) = -1.1\mathrm{V}\ \text{for p-type transistors; and}$$

$$R_s = 50\ \mathrm{mV}/(I_{dlin}@VG-V_{Tlin}) = 1.1\mathrm{V}\ \text{for n-type transistors,}$$

where $I_{dlin}$ is the drain current measured at the linear region and $V_{Tlin}$ is the threshold voltage measured at the linear region.

For iso transistors, the pitch is 0.384 um while nested transistors have a pitch of 0.182 um. From the figures, $R_s$ for nested transistors (solid line) is higher than that of iso transistors (broken line). For p-type transistors, the $R_s$ converge as $L_G$ approaches zero. However, for n-type transistors, $R_s$ remains different as $L_G$ is equal to zero, for example, a delta of about 10%. Due to the $R_s$ delta, transistors in nested and iso regions will perform differently, such as switching speed. The transistors with higher $R_s$ will switch slower than the transistors with lower $R_s$. This results in overall performance degradation of the IC since the slower switching transistors must be accommodated.

Figure 3:
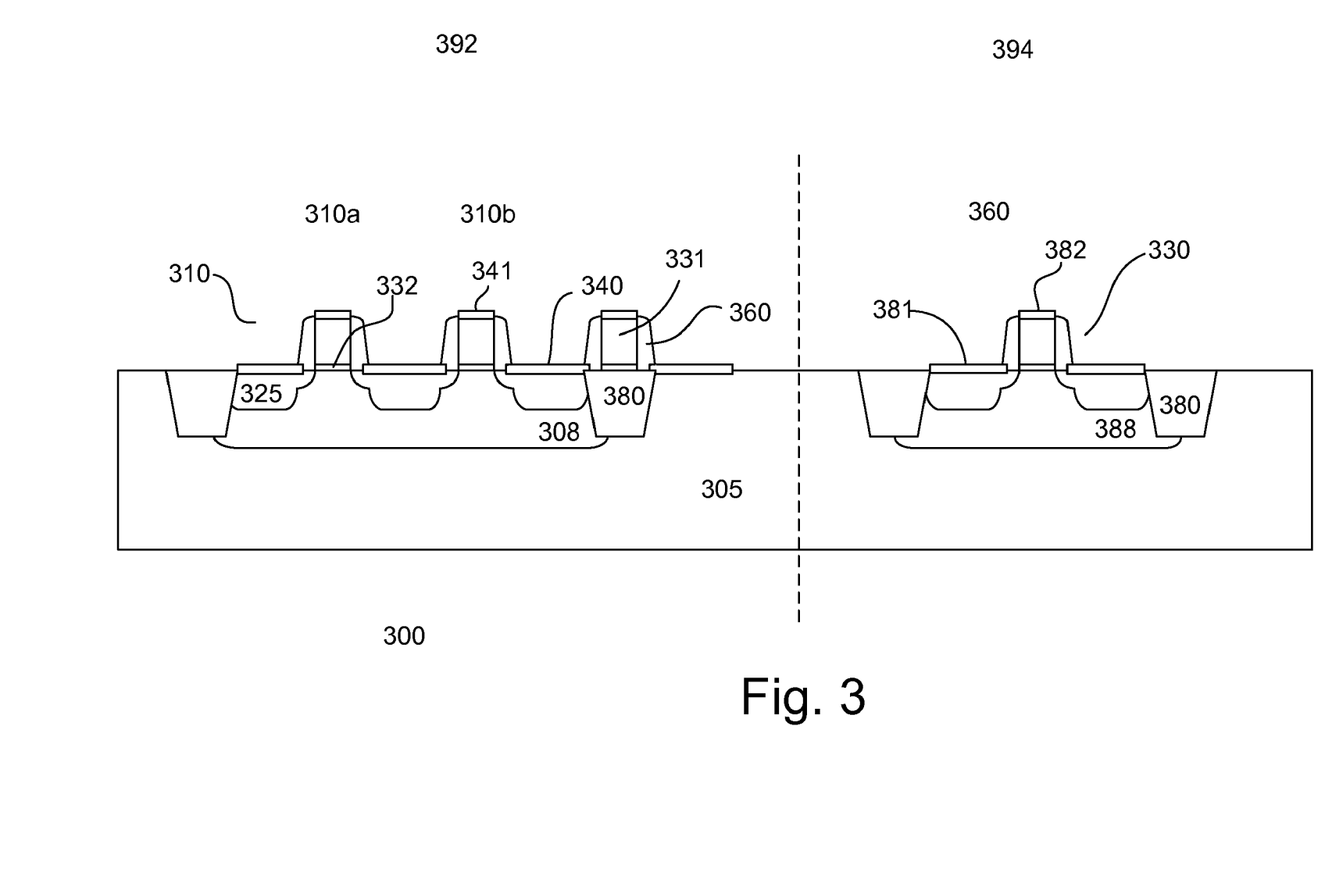
FIG. 3 shows a portion of an IC in accordance with one embodiment of the invention.

FIG. 3 shows a portion 300 of an IC in accordance with one embodiment of the invention. The IC, for example, can be any type of IC, such as dynamic random access memories (DRAMs), static random access memories (SRAMs), non-volatile memories including programmable read-only memories (PROM) and flash memories, optoelectronic devices, logic devices, communication devices, digital signal processors (DSPs), microcontrollers, system-on-chip, as well as other types of devices. Other types of ICs are also useful.

The portion of the IC comprises a substrate 305. The substrate, for example, comprises a semiconductor substrate, such as silicon. Other types of substrates, such as silicon on insulator, are also useful. The substrate, in one embodiment, comprises a lightly doped p-type substrate. As shown, the substrate includes at least first and second device regions 392 and 394. The first and second regions correspond to, for example, nested and iso regions. The nested and iso regions are defined by first and second doped wells 308 and 388. The doped wells comprise dopants having a first polarity type. The wells serve as active regions of the substrate, separated by isolation regions 380. The isolation regions comprise, in one embodiment, shallow trench isolations (STIs). Other types of isolation regions can also be used.

A plurality of transistors 310 and 360 are provided in the nested and iso regions. A transistor includes a gate stack 330 and source/drain diffusion regions 325. The gate stack generally comprises polysilicon gate electrode 331 over a gate dielectric 332. Dielectric liner and spacers 360 can be provided. The liner lines the gate and substrate while the spacers are disposed on the gate sidewalls. Typically the liner comprises oxide while the spacers are formed from nitride. Other combinations of materials are also useful. Nested transistors are provided with metal silicide contacts 340 and 341 over the diffusion regions and gate electrode; iso transistors are provided with metal silicide contacts 381 and 382 over the diffusion regions and gate electrode. The metal silicide contacts, for example, comprise nickel or its alloy, such as NiPtSi. Other types of metal, for example $Co_xSi_y$, are also useful. The contacts serve as terminals of the transistors.

Transistors in the nested region are densely populated. For example, the gates of the transistors have a pitch which is equal to about ground rule. Typically, adjacent transistors in the nested region share diffusion regions (e.g., 310*a-b*). Other transistor configurations in the nested region are also useful. In contrast, transistors in the iso region are less densely packed. The gates of the iso transistors have a pitch which is greater than that of the nested transistors, for example, at least about 2 times. The transistors may be individual transistors which do not share diffusion regions. As shown, the portion of the IC includes three nested transistors and one iso transistor. It is understood that actual ICs have many more nested and iso transistors as well as other types of components.

In one embodiment, the first polarity type comprises p-type dopants, forming p-wells for n-type (second polarity type) transistors. The transistors in the iso and nested regions, in one embodiment, comprises about the same $R_s$. For example, the difference in $R_s$ between the two regions should be less than 5%. In one embodiment, metal silicide contacts of nested and iso transistors comprise about the same thickness to produce about the same $R_s$.

Figure 4:
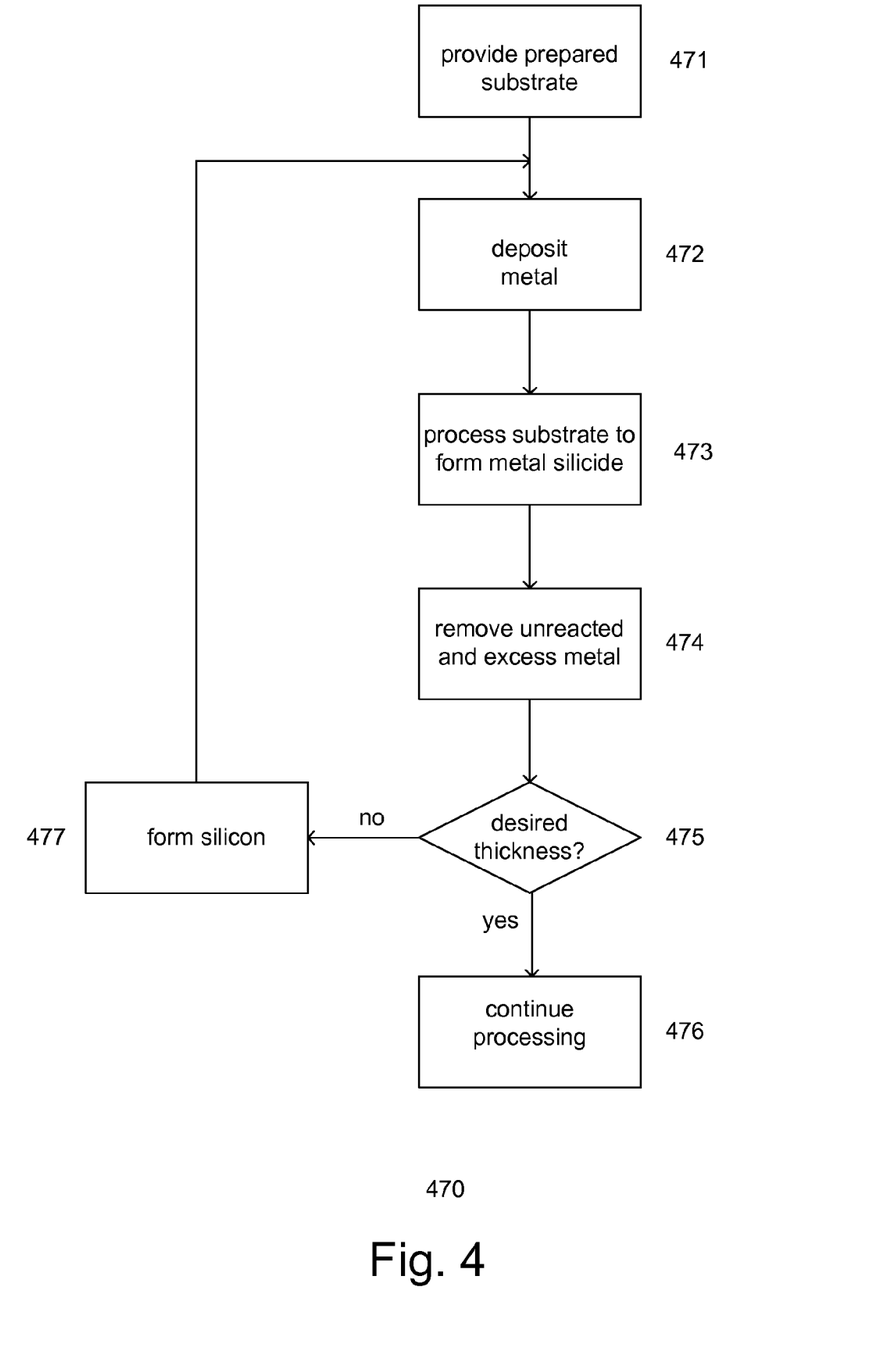
FIG. 4 shows a process of forming metal silicide contacts in accordance with one embodiment of the invention.

FIG. 4 shows a process 470 for reducing $R_s$ in contacts of, for example, transistors. In one embodiment, the process includes forming metal silicide contacts having a thickness to achieve the desired $R_s$. The process commences by providing a substrate prepared for forming metal silicide contacts at step 471. The substrate, for example, includes contact regions, such as doped diffusion regions and gate electrodes of transistors. The surface of the substrate is prepared by a presalicide clean, such as SP+SC1+SC2. A metal layer is deposited on the prepared substrate at step 472. The metal layer, for example, comprises nickel or alloys thereof, such as NiPtSi. Other types of metals or alloys, such as $Co_xSi_y$, are also useful. The metal layer can be deposited by various techniques, such as sputtering. Other techniques are also useful.

At step 473, the substrate is processed. In one embodiment, a salicide process is performed. The salicide process comprises, for example, annealing the substrate. Typically, the substrate is annealed at 500° C. spike in $N_2$—$O_2$. The salicide process causes a reaction between the silicon and metal to form metal silicide in the contact region. Excess metal such as unreacted metal over the non-contact regions as well as in the contact regions are removed at step 474. Typically, a HCl/$HNO_3$ etch is performed to remove excess metal. The thickness of the metal silicide contact can be, for example, about 180-220 Å.

Depending on whether the metal silicide contact has a thickness to produce the desired $R_s$ at step 475, the process proceeds to either step 476 or 477. If the metal silicide contact needs to be thicker, the process continues to step 477. At step 477, a processing layer is formed on the substrate, covering the transistors. The processing layer, in one embodiment, comprises silicon. The processing layer is formed by, for example, CVD. The processing layer can be polycrystalline or amorphous silicon. The thickness of the processing layer is about 50 Å. Other thicknesses are also useful. Alternatively, the processing layer can be formed by implanting silicon ions on the substrate. Excess silicon on the substrate, for example, in regions other than the contact regions is removed. Removal can be achieved with reactive ion etching (RIE). Steps 472-475 are repeated until the metal silicide contacts have a thickness to produce the desired $R_s$. After the metal silicide has the desired thickness, the process continues at 476 to form the IC.

FIGS. 5*a-f* show a process for forming an IC in accordance to one embodiment of the invention, the IC comprising a first and a second device regions having transistors. In one embodiment, the first device region is a nested region wherein transistors are located in close proximity relative to each other. The pitch between the transistors in the nested region, for example, is about 180 nm. The second device region is an iso region wherein transistors are located further apart as opposed to transistors in the nested area. The pitch between the transistors in the iso region, for example, is about 384 nm.

Figure 5A:
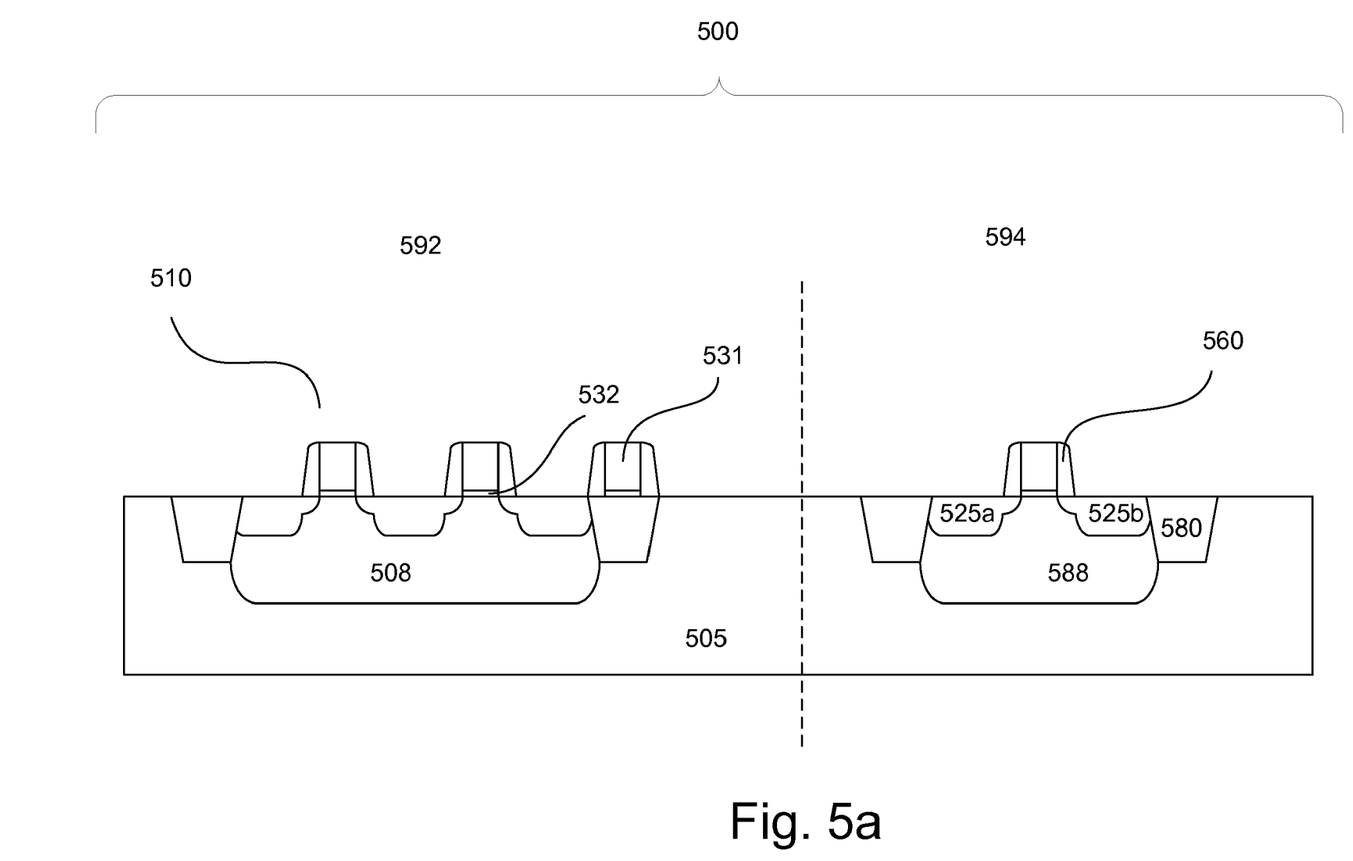
FIGS. 5a-f show a process for forming an IC in accordance with one embodiment of the invention.

Referring to FIG. 5*a*, an IC 500 comprising a first device region 592 and a second device region 594 is illustrated. In one embodiment, the first device region is a nested region and the second device region is an iso region. Transistors 510 are formed within the first and second device region. A semiconductor substrate 505 is provided. The substrate, in one embodiment, comprises a silicon substrate. Other types of substrates, such as a lightly p-doped silicon or SOI, may also be useful. The substrate is prepared with active regions 508 and 588. The active regions each comprise a heavily doped region with dopants of a first polarity type. To form the active regions, conventional ion implantation techniques, such as implantation with a mask can be used. Other techniques for forming the active region are also useful.

Isolating the active regions from other device regions on the substrate are isolation regions 580. The isolation regions, for example, comprise STI regions. Various conventional processes can be employed to form the STI regions. For example, the substrate can be etched using conventional etch and mask techniques to form trenches which are then filled with dielectric material such as silicon oxide. Chemical mechanical polishing (CMP) can be performed to remove excess oxide and provide a planar substrate top surface. The STI regions can be formed, for example, prior to or after the formation of the doped wells.

Gate layers are formed on the substrate. Forming the gate layers, for example, comprises sequentially forming a gate dielectric layer 532 and a gate electrode layer 531 on the substrate surface. In one embodiment, the gate dielectric layer comprises thermal oxide. Other types of gate dielectrics are also useful. The gate electrode layer, for example, comprises polysilicon. Other types of gate electrode materials, such as metal gate, are also useful. The polysilicon can be in-situ doped or doped by ion implantation after deposition. Providing undoped polysilicon is also useful.

Spacers 560 are formed on the gate sidewalls. The spacers comprise, for example, a dielectric material such as oxide and/or nitride. The spacers can be formed using conventional spacer processes, such as depositing a blanket dielectric layer on the substrate and gate. The dielectric layer is then patterned to remove the horizontal portions, leaving the spacers at the gate sidewalls.

Source/drain diffusion regions 525a-b are formed in the active region of the substrate adjacent to the gate. The diffusion regions, for example, comprise heavily doped regions of the first polarity type. The doped regions can be formed by ion implantation. The implant can be self-aligned or formed using an implant mask. Other techniques for forming the diffusion regions are also useful. In one embodiment, the diffusion regions comprise lightly doped and heavily doped regions via, for example, a two step ion implantation process. For example, the lightly doped regions are formed after the gate is patterned and the heavily doped regions are formed after spacer formation. After the formation of diffusion regions, the dopants are activated by, for example, a thermal annealing process. The annealing also serves to facilitate recovery from any deformation to the crystal structure incurred during the process of ion implantation. Typically, the anneal is carried out at abut 1080° C. with a 220° C./minute ramp up rate. In other embodiments, the activation of dopants can be integrated into subsequent processing steps.

Figure 5B:
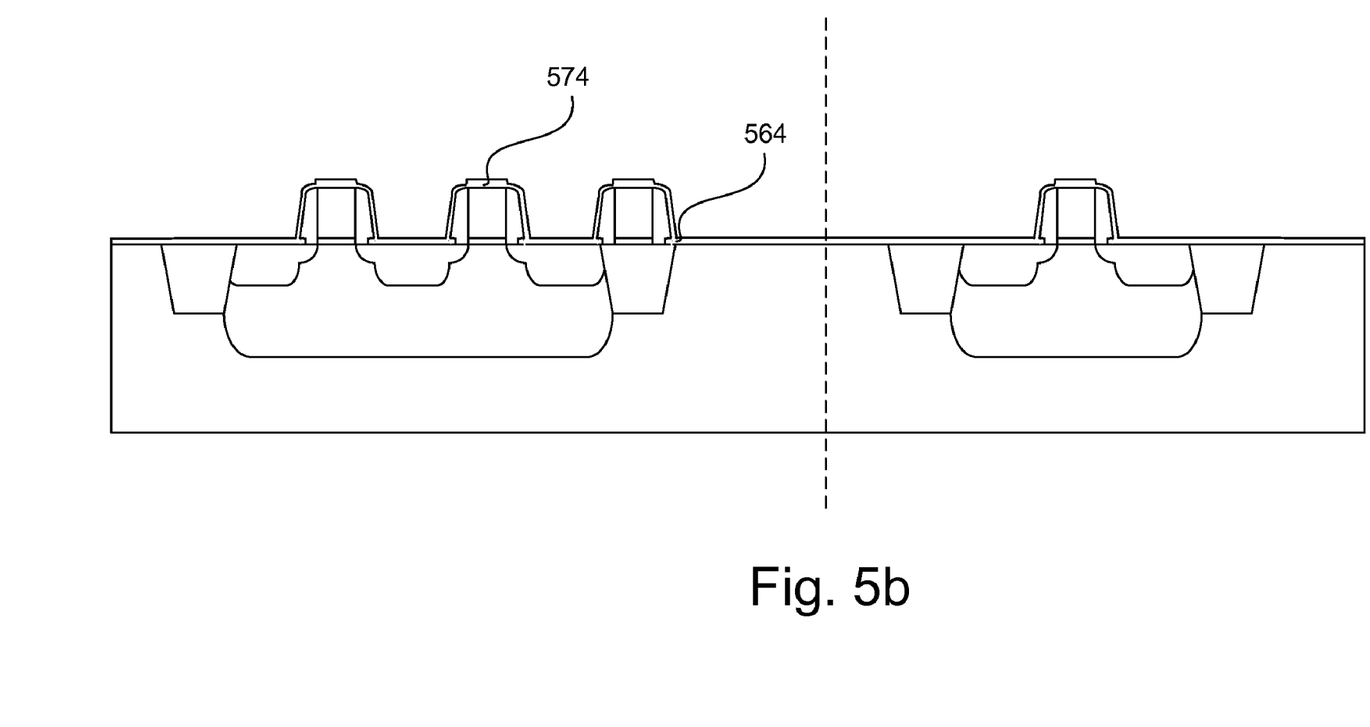

In one embodiment, referring to FIG. 5b, a pre-silicide clean can be performed. The pre-silicide clean, for example, comprises wet cleaning using DHF in a dilute aqueous solution. Other clean chemistries or processes are also useful. The pre-silicide clean prepares the substrate for metal deposition by removing native oxide on the gate and source/drain diffusion regions. The clean process, for example, forms undercuts 564 in the bottom of the spacers.

A metal layer 574 is deposited on the substrate, covering the transistors. In one embodiment, the metal layer comprises nickel or nickel-alloy such as NiPtSi. Other types of metals, for example, $Co_xSi_y$, are also useful. The thickness of the metal layer, in one embodiment, is about 220 Å.

Figure 5C:
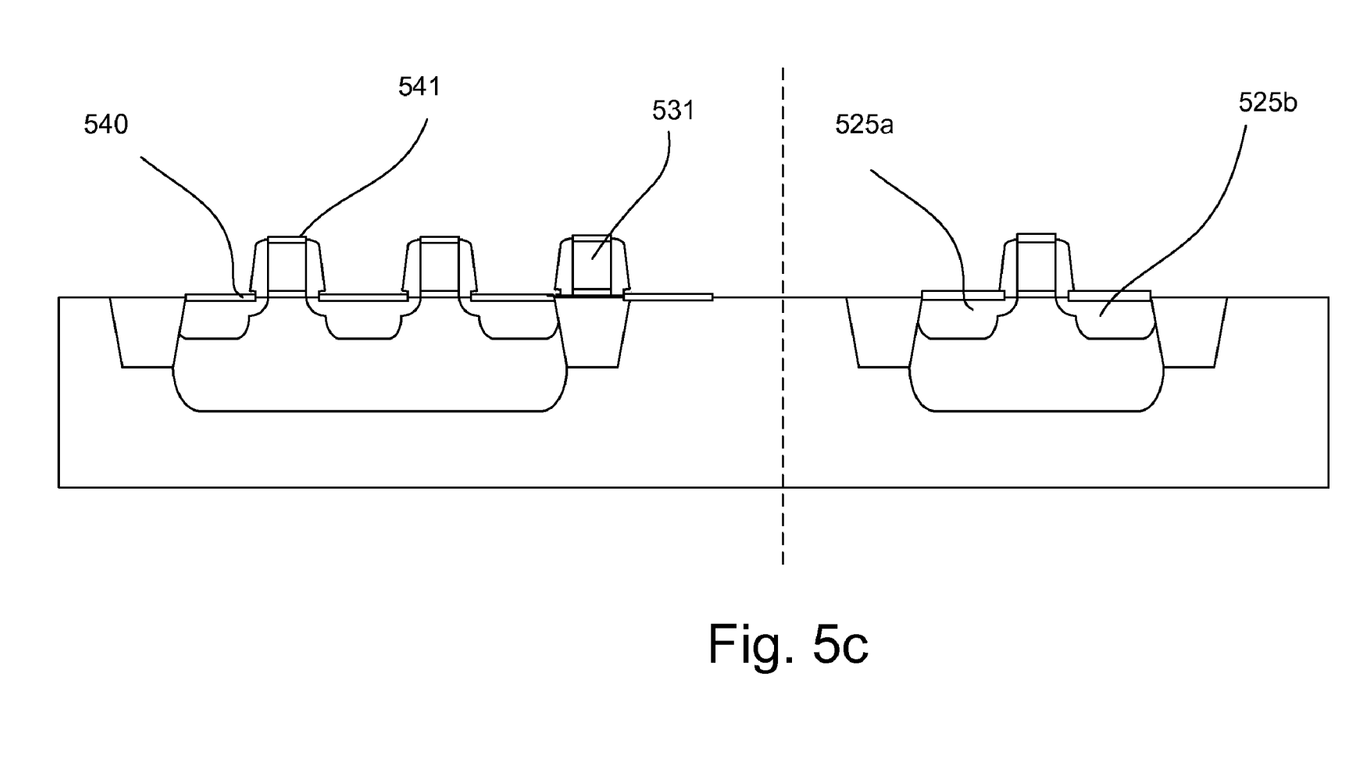

Referring to FIG. 5c, a salicide process is preformed to form metal silicide contacts 540 and 541 over the diffusion regions (525a-b) and the gate electrode (531). In one embodiment, the salicide process forms nickel or nickel alloy silicide contacts. Other types of metal-silicide contacts are also useful. The salicide process, for example, annealing the substrate, causing a reaction between the metal and silicon. In one embodiment, the substrate is spiked annealed at a temperature of about 500° C. in $N_2$—$O_2$ ambient. Other process parameters may also be useful. The excess or unreacted metal on the substrate, such as over the STIs and gate sidewalls, is removed. Removal can be achieved using a selective wet etch clean to the metal material, such as nickel.

As discussed, the $R_s$ of nested transistors are higher than the $R_s$ of iso transistors. To compensate for the difference of $R_s$ of the different types of transistors, the thickness of the metal silicide contacts of the nested transistors are increased. In one embodiment, the metal silicide contacts of the nested transistors are further processed.

Figure 5D:
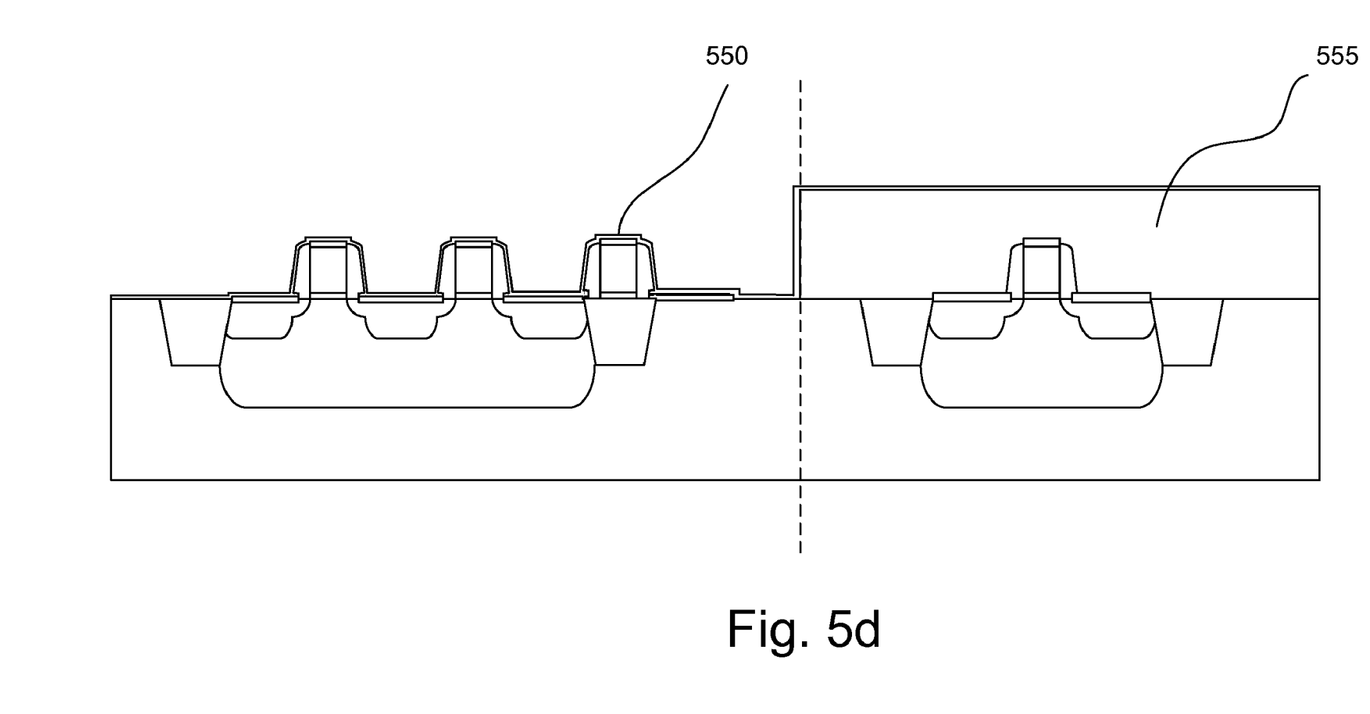

As shown in FIG. 5d a mask layer 555 is deposited over the isolated area to protect transistors therein from processing. A processing layer 550 is formed on the substrate, covering the mask and transistors in the nested region. The processing layer, in one embodiment, comprises silicon. The silicon, for example, can be polysilicon or amorphous silicon formed by CVD. Other techniques, such as ALD is also useful. The thickness of the processing layer, for example, is about 50 Å. In an alternative embodiment, the processing layer is formed by implanting silicon onto the substrate.

Figure 5E:
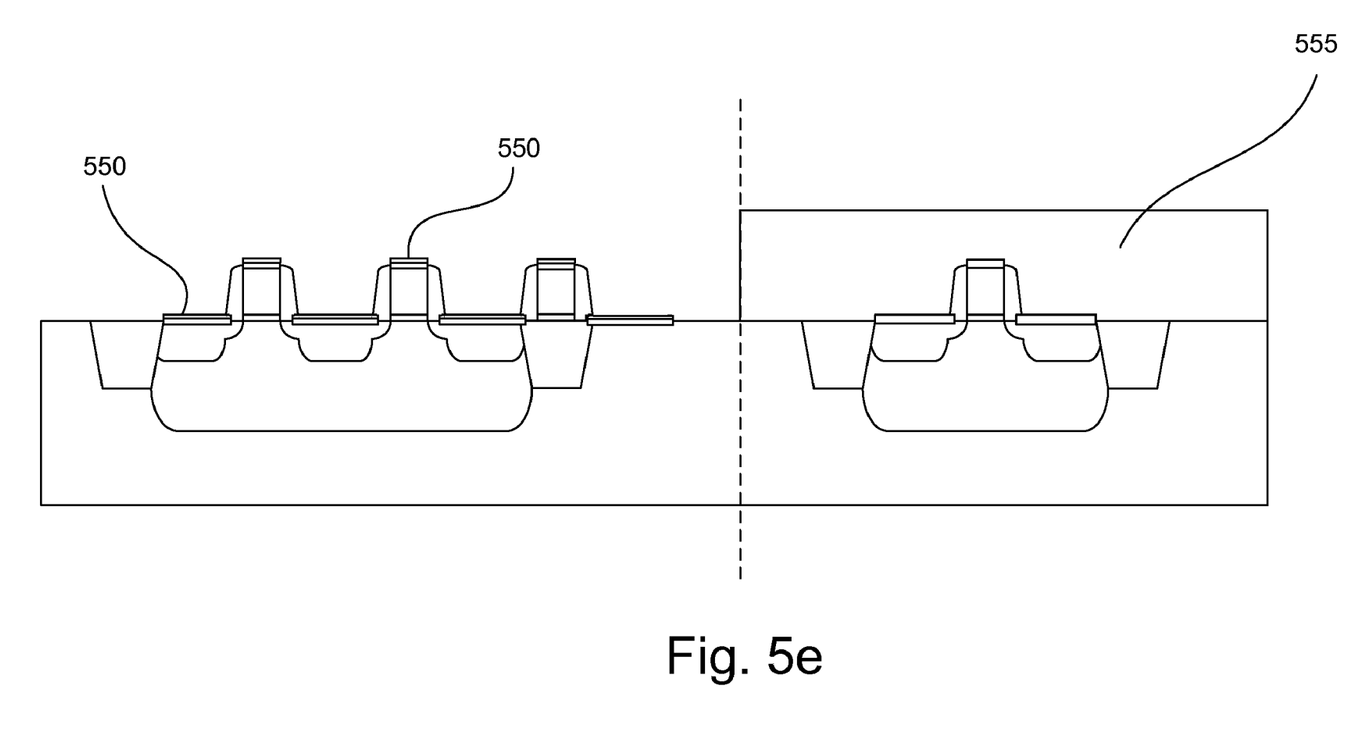

The excess processing layer on the substrate, such as over the STIs and gate sidewalls, are removed as shown in FIG. 5e. In one embodiment, the excess processing layer is removed by selective RIE.

Figure 5F:
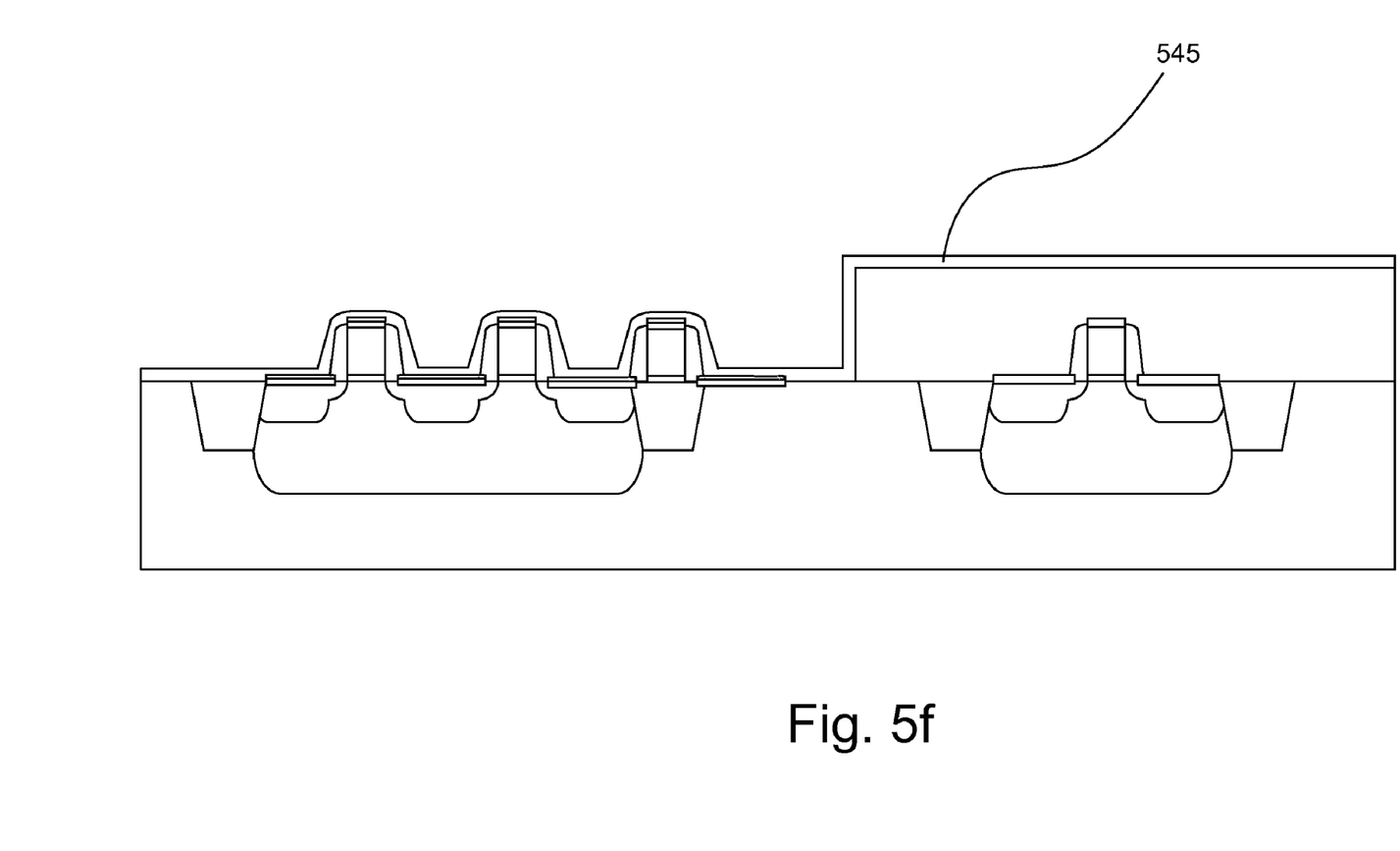

Referring to FIG. 5f, a metal layer 545 is deposited over the substrate, covering the diffusion regions and gate. Preferably, the metal layer comprises nickel or nickel alloy, such as NiPt or NiPtSi. Typical thickness of the metal layer is about 220 Å. A salicidation process is performed. The salicidation process comprises, for example, annealing the substrate to increase the thickness of the metal silicide contacts. Excess or unreacted metal is removed. The processes of forming a processing layer, stripping unwanted processing layer from the substrate, depositing a metal layer, salicidation process, and removing excess metal are repeated until the desired $R_s$ is achieved. The process of forming the IC continues. For example, processes of forming additional device components, interconnects, passivation and package are performed.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate having first and second device regions;
   first metal silicide contacts in the first device region, the first metal silicide contacts comprise a first metal silicide layer; and
   second metal silicide contacts in the second device region which are different than the first metal silicide contacts, the second metal silicide contacts comprise a second metal silicide contact layer over the first metal silicide layer.

2. The device of claim 1 comprises:
   first transistors in the first device region, wherein the first metal silicide contacts are contacts of the first transistors; and
   second transistors in the second device region, wherein the second metal silicide contacts are contacts of the second transistors.

3. The device of claim 2 wherein the first and second transistors comprise n-type transistors.

4. The device of claim 2 wherein:
   the first transistors comprise iso transistors and the second transistors comprise nested transistors.

5. The device of claim 1 wherein the second metal silicide contacts comprise a target thickness.

6. The device of claim 4 wherein the second metal silicide contact stacks comprise a target thickness, the target thickness results in $R_s$ of the first transistors and $R_s$ of the second transistors being about the same.

7. The device of claim 5 wherein the target thickness results in a target $R_s$.

8. A device comprising:
a substrate having first and second regions;
a first transistor in the first region, the first transistor include first metal silcide contacts, the first metal silicide contacts comprise a first metal silicide layer;
a second transistor in the second region, the second transistor includes second metal silicide contacts in the second region; the second metal silicide contacts, which are different from the first metal silicide contacts, comprise a second metal silicide contact layer over the first metal silicide contact layer.

9. The device of claim 8 wherein the first and second transistors comprise n-type transistors.

10. The device of claim 8 wherein the second metal silicide contacts comprise a target thickness.

11. The device of claim 10 wherein the target thickness results in a target $R_s$ of the second transistor being about the same as that of the first transistor.

12. An IC comprising:
a substrate having first and second regions;
first transistors in the first region, wherein the first transistors include first metal silicide contacts;
second transistors in the second region, wherein the second transistors include second metal silicide contacts, which are different than the first metal silicide contacts, the second metal silicide contacts comprise more metal silicide layers than the first metal silicide contacts.

13. The IC of claim 12 wherein the second metal silicide contacts comprise a target thickness to result in the first and second transistors having about the same $R_s$.

14. The IC of claim 12 wherein the transistors comprise n-type transistors.

15. The IC of claim 12 wherein:
the first transistors comprise iso transistors and the second transistors comprise nested transistors.

16. The IC of claim 15 wherein the second metal silicide contacts comprise a target thickness to result in the first and second transistors having about the same $R_s$.

17. The IC of claim 15 wherein the first and second transistors are n-type transistors.

18. The device in claim 12 wherein:
the first metal silicide contacts comprise a first metal silicide layer; and
the second metal silicide contacts comprise a second metal silicide layer over the first metal silicide layer.

19. The IC in claim 18 wherein the first and second metal silicide layers are of the same type of metal silicide layers.

* * * * *